(12) United States Patent
Gonya et al.

(10) Patent No.: US 8,878,072 B2
(45) Date of Patent: Nov. 4, 2014

(54) HIGH RELIABILITY FLUID-TIGHT LOW-PROFILE ELECTRICALLY CONDUCTIVE INTERCONNECTS FOR LARGE SCALE FRAME ATTACHMENT

(75) Inventors: Stephen Gonya, Endicott, NY (US); Jim Patterson, Owego, NY (US); Kenn Twigg, Sayre, PA (US)

(73) Assignee: Lockheed Martin Corporation, Bethesda, MA (US)

( * ) Notice: Subject to any disclaimer, the term of this patent is extended or adjusted under 35 U.S.C. 154(b) by 165 days.

(21) Appl. No.: 13/527,180

(22) Filed: Jun. 19, 2012

(65) Prior Publication Data

US 2013/0333935 A1 Dec. 19, 2013

(51) Int. Cl.
*H05K 1/03* (2006.01)
*H05K 1/11* (2006.01)
*H05K 3/00* (2006.01)

(52) U.S. Cl.
USPC ........... 174/255; 174/256; 174/261; 174/264; 174/265; 174/266; 29/829

(58) Field of Classification Search
CPC ..... H05K 1/111; H05K 1/112; H05K 3/4069; H05K 3/4046; H05K 1/115
USPC ................. 174/261, 264–266, 255, 256, 262; 29/829; 439/66
See application file for complete search history.

(56) References Cited

U.S. PATENT DOCUMENTS

| | | | |
|---|---|---|---|
| 4,574,331 A * | 3/1986 | Smolley | 361/735 |
| 4,859,188 A * | 8/1989 | Neumann | 439/45 |
| 5,286,417 A | 2/1994 | Mahmoud et al. | |
| 5,315,481 A * | 5/1994 | Smolley | 361/707 |
| 5,368,883 A | 11/1994 | Beaver | |
| 5,427,304 A * | 6/1995 | Woods et al. | 228/190 |
| 5,608,434 A | 3/1997 | Wilson et al. | |
| 5,738,797 A | 4/1998 | Belke, Jr. et al. | |
| 5,938,455 A | 8/1999 | Glovatsky et al. | |
| 6,188,582 B1 * | 2/2001 | Peter | 361/760 |
| 6,198,630 B1 | 3/2001 | Cromwell | |
| 6,264,476 B1 * | 7/2001 | Li et al. | 439/66 |
| 6,370,770 B1 * | 4/2002 | Fan et al. | 29/877 |
| 6,386,890 B1 * | 5/2002 | Bhatt et al. | 439/67 |
| 6,574,114 B1 * | 6/2003 | Brindle et al. | 361/769 |
| 6,593,900 B1 | 7/2003 | Craven | |
| 6,695,623 B2 * | 2/2004 | Brodsky et al. | 439/66 |
| 7,815,475 B2 | 10/2010 | Peloza et al. | |
| 2002/0098721 A1 * | 7/2002 | Fan et al. | 439/66 |
| 2008/0173698 A1 * | 7/2008 | Marczi et al. | 228/180.1 |
| 2008/0244898 A1 | 10/2008 | Shacklette et al. | |

* cited by examiner

*Primary Examiner* — Timothy Thompson
*Assistant Examiner* — Sherman Ng
(74) *Attorney, Agent, or Firm* — Miles & Stockbridge PC; James T. Carmichael

(57) ABSTRACT

A method for forming a frame attachment interconnect between a substrate and a frame is disclosed. The method can include applying a composite material (e.g., epoxy-glass prepreg) to a surface of a substrate. The composite material can have one or more holes disposed to substantially align with a corresponding pad on the surface of the substrate. A metal disc is placed in each hole of the composite material on top of the corresponding pad. A frame member can be placed on top of the composite material and the metal discs. The frame member can have one or more pads disposed to substantially align with the metal discs. The substrate, composite material, metal discs and frame combination can be cured in a controlled atmosphere that can include a vacuum and a predetermined temperature to create discrete electrical connections between adjacent pads but with each encapsulated and electrically isolated.

19 Claims, 6 Drawing Sheets

HIGH RELIABILITY FLUID-TIGHT LOW-PROFILE ELECTRICALLY CONDUCTIVE INTERCONNECTS FOR LARGE SCALE FRAME ATTACHMENT

Embodiments relate generally to electrical circuit interconnects and, more particularly, to interconnects for connecting a substrate (e.g., a printed wiring board) to a frame.

Some conventional frame attachment interconnects, such as pigtail connectors, attach to one side of a printed wiring board (or printed circuit board) and may allow for movement between the board and the frame. Pigtails may offer compliancy but may be limited in pin out and may be difficult to place and attach via soldering. Pigtails interconnects may also require increased board surface area (or "real estate") for the pigtail joints.

Embodiments of the present invention were conceived in light of the above mentioned problems or limitations, among other things.

An embodiment includes a method for connecting a circuit board and a frame. The method includes providing a printed circuit board having one or more copper pads applied to one of its surfaces. A frame member is provided that has one or more copper pads applied to one of its surfaces. An epoxy glass prepreg material can be applied to the surface of the printed circuit board where the pads are disposed. The prepreg material can have one or more holes in substantial alignment with the pads on the surface of the printed circuit board.

The method can include placing a metal disc in each hole of the prepreg material so as to be disposed within the hole of the prepreg material and to contact the one or more copper pads on the surface of the printed circuit board. The frame member is placed on the prepreg material and the metal discs such that the copper pads on the frame member are in substantially alignment with the metal discs. The assembly (e.g., printed wiring board, prepreg material, metal discs and frame member) is cured in a controlled atmosphere that can include a vacuum and a temperature of about 125 degrees Celsius to form an electrically conductive metallic joint between adjacent pads that are each encapsulated and electrically isolated.

The metal discs can include indium or an indium-lead alloy that facilitates forming a metallurgical connection to the pads and also provides high compliancy for thermal-cycle reliability. The prepreg material can include a composite material of fiber cloth impregnated with a rubberized epoxy and using the cloth as a scrim for bondline thickness control.

Another embodiment includes a method for forming an interconnect between a substrate and a frame. The method can include applying a composite material to a surface of a substrate, the composite material having one or more holes disposed to substantially align with one or more corresponding pads on the surface of the substrate. A metal disc can be placed in each hole of the composite material on top of the corresponding pad. A frame member can be placed on top of the composite material and the metal discs, the frame member having one or more pads disposed to substantially align with the metal discs. The interconnect assembly (i.e., the substrate, composite, metal discs and frame member) can be cured in a controlled atmosphere. The controlled atmosphere can include a vacuum and a predetermined temperature (e.g., about 125 degrees Celsius).

The composite material can include an epoxy glass prepreg material, or a fiber cloth impregnated with a rubberized epoxy. Each metal disc can include indium alone or an indium-lead alloy.

Another embodiment includes an interconnect having a substrate with one or more electrical connection pads on a surface of the substrate. The interconnect can also include a composite material disposed on the surface of the substrate, the composite material can have one or more holes formed to substantially align with the one or more electrical connection pads on the surface of the substrate. The interconnect can include a metal disc disposed in each of the one or more holes of the composite material. The interconnect can further include a frame having a surface with one or more electrical connection pads applied thereto.

The composite material of the interconnect can serve to bond the substrate to the frame. The composite material of the interconnect can include an epoxy glass prepreg material or a fiber cloth impregnated with a rubberized epoxy. Each metal disc can make an electrical connection between a pad on the substrate and a corresponding pad on the frame. Each metal disc can include an indium-lead alloy. Each metal disc can include indium.

The controlled atmosphere can include a vacuum and/or a predetermined temperature, such as about 125 degrees Celsius.

DETAILED DESCRIPTION

In general, an embodiment can provide a low-profile, electrically conductive joint between a metal frame and a substrate, such as a printed wiring board. The joint can be fluid tight and can withstand strenuous thermal cycle and vibration environments, such as those required for a system to be approved for military use. The interconnect joint in an embodiment can be compliant enough to accommodate a large mismatch in the coefficient of thermal expansion (CTE) between the frame and substrate over a wide temperature range and through multiple thermal cycles.

As mentioned above, an embodiment can also provide a fluid tight seal between a frame and a substrate (e.g., a printed circuit board), which can prevent water, solvents or other fluids from entering between the frame and the substrate.

Embodiments can include an indium or an indium/lead (In/Pb) alloy member that creates a metallurgical joint between the frame and substrate by thermal-compression bonding. Also, an epoxy-glass prepreg material can be used to attach the frame to the substrate. In addition, the epoxy-glass prepreg seals the joint between the frame and the substrate and serves as a scrim for bondline thickness control.

An embodiment can be used, for example, to provide an electrical interconnect between a large-scale frame being attached to a printed wiring board assembly. The electrical interconnect can be used for communication with antennas, sensors and other electrically functional components that may be mounted on the frame.

Figure 1:
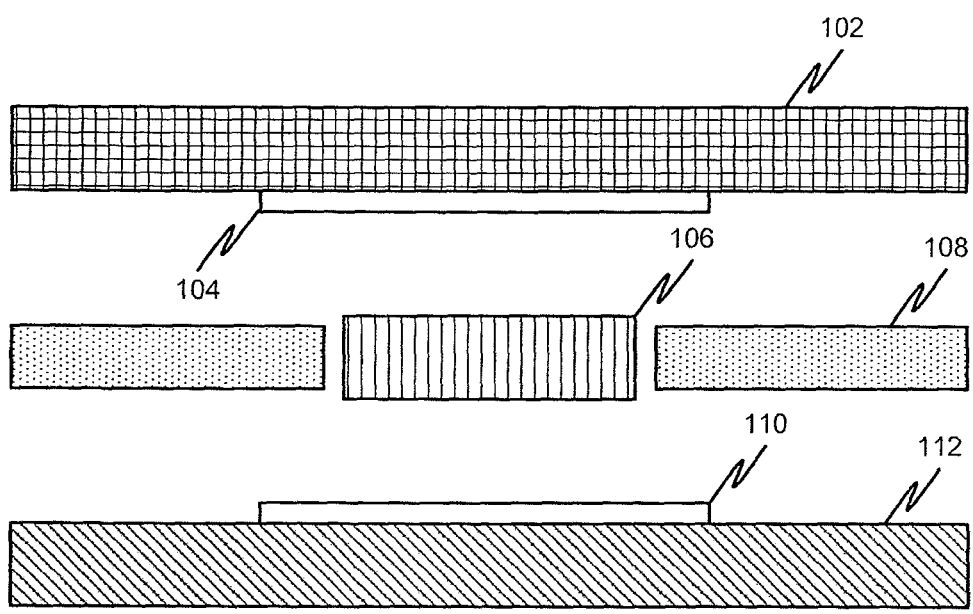
FIG. 1 shows an exploded diagram of a preassembled frame attachment interconnect assembly in accordance with at least one embodiment.

FIG. 1 shows a frame attachment interconnect 100 before being connected. In particular, a frame member 102 (e.g., 6061-T6 aluminum plate) has a copper pad 104 attached to a surface thereof. Epoxy-glass prepreg material 108 (e.g., F155/120 manufactured by Hexcel Corp. of Stamford, Conn.) surrounds a metal disc 106. A second copper pad 110 is attached to a printed wiring board 112 (e.g., an epoxy glass printed wiring board such as ISOLA FR406 manufactured by Isola Group of Chandler, Ariz.).

For example, the frame member 102 can be an aluminum plate about 100 mils thick. The pads (104 and 110) can be copper pads about 1.4 mils thick and about 30×30 mils, with an electroless nickel immersion gold (ENIG) finish. The prepreg material can be about 5 mils thick. The metal disc 106 can be about 20 mils in diameter and about 8-10 mils in thickness. The printed wiring board can be about 62 mils thick. Rectangular pads and circular metals discs, and their respective dimensions, are described for illustration purposes, it will be appreciated the pads and/or discs can be other shapes and/or sizes.

The epoxy-glass prepreg material can be any suitable composite material. For example, the epoxy-glass prepreg material can include 120 glass cloth impregnated with a rubberized epoxy for improved bondline toughness, such as Hexcel F155, to flow and seal the perimeter between the board and the frame. The prepreg material can also control the bondline thickness to about 5 mils, for example. The joint pitch can be less than or equal to about 0.05 inch, for example.

Figure 2:
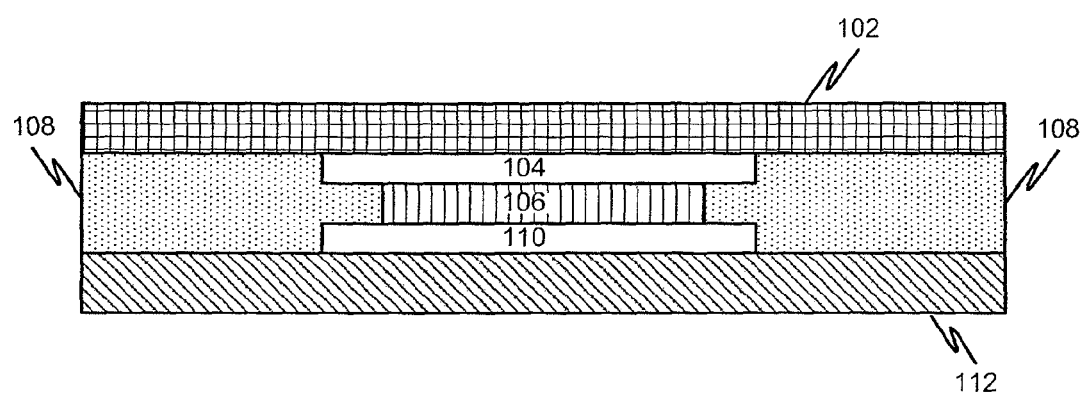
FIG. 2 shows an assembled frame attachment interconnect in accordance with at least one embodiment.

After subjecting the preassembled printed wiring board and frame assembly to a vacuum bag cure at 125 degrees Celsius, the assembly (e.g., substrate, prepreg, metal discs and frame) bonds as shown in FIG. 2. The metal discs (e.g., indium or indium-lead) are metallurgically welded to the pads on the circuit board and the frame. As mentioned above, the pads (or plates) can be any suitable material such as copper and/or gold (e.g., copper with an electroless nickel immersion gold (ENIG) finish).

As shown in FIG. 2, the frame plate member 102 and first copper pad 104 are joined to the metal disc 106 on a top side. On a bottom side of the indium 106, the second copper pad 110 and printed wiring board 112 have been connected. Also as shown in FIG. 2, the epoxy-glass prepreg material 108 has surrounded the metal disc 106. The epoxy-glass prepreg material 108 also forms a mechanical bond between the printed wiring board 112 and the frame member 102.

Figure 3:
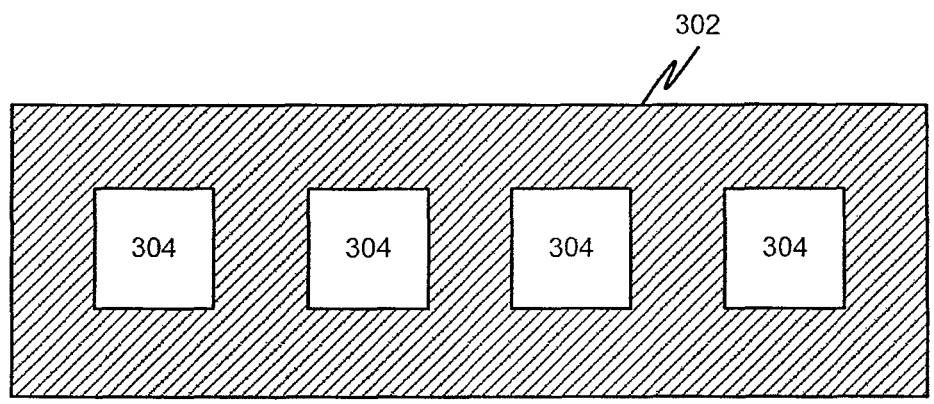
FIG. 3 shows a printed wiring board with pads in accordance with at least one embodiment.
Figure 4:
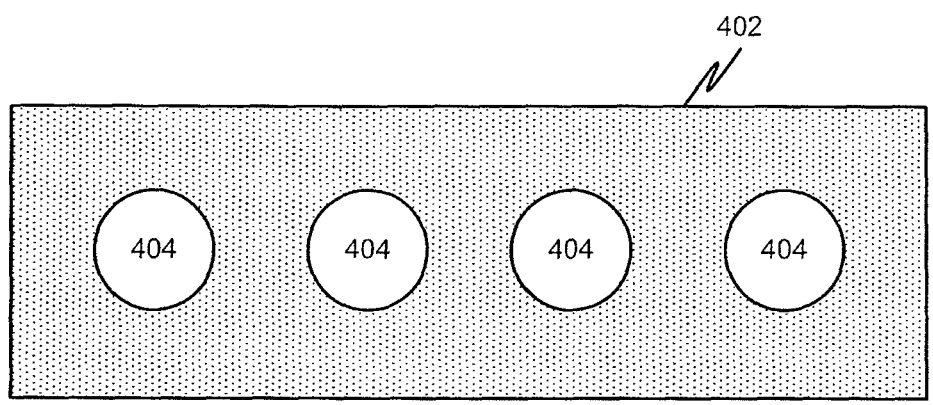
FIG. 4 shows the printed wiring board of FIG. 3 with epoxy glass prepreg applied having holes aligned with the pads in accordance with at least one embodiment.
Figure 5:
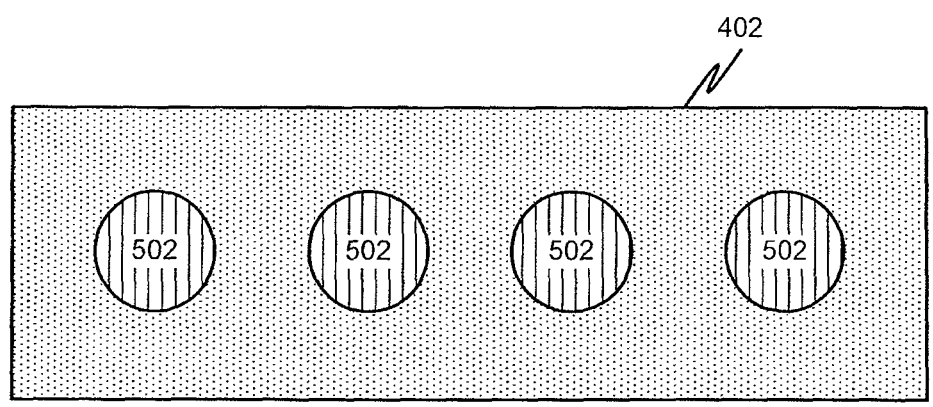
FIG. 5 shows the printed wiring board of FIG. 4 having a metal disc placed in each hole in accordance with at least one embodiment.

FIGS. 3 through 5 show various stages of assembly of a printed wiring board to frame interconnection in accordance with at least one embodiment. FIG. 3 shows a printed wiring board 302 with pads 304 that can have an electroless nickel immersion gold (ENIG) finish.

FIG. 4 shows a step in which an epoxy glass prepreg material that has been punched with holes (e.g., of about 20 or 28 mils in diameter) is placed over the printed wiring board and the holes have been substantially aligned with the pads. The prepreg material 402 has a series of holes 404 that align with the pads (304 as show in FIG. 3).

In FIG. 5, metal discs 502 (e.g., indium-lead discs) have been placed in each hole of the prepreg material. Following placement of the metal discs, a frame member is placed over the metal discs and the assembly (e.g., circuit board, prepreg, metal discs and frame) is subjected to a vacuum bag cure at about 125 degrees Celsius.

Figure 6:
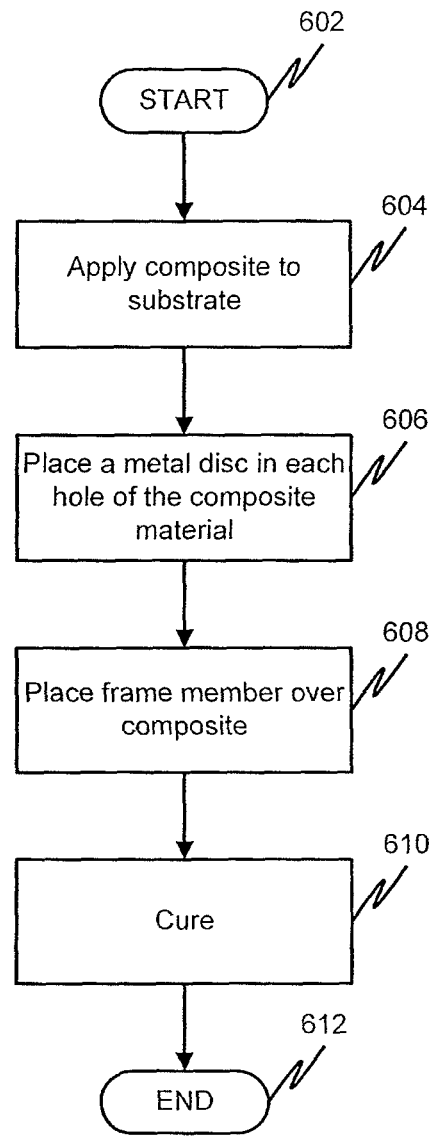
FIG. 6 is a chart showing an example method for forming a frame attachment interconnect in accordance with at least one embodiment.

FIG. 6 shows a chart of an example process for forming a printed circuit board to frame interconnect in accordance with at least one embodiment. The process begins at 602 and continues to 604.

At 604, a strip of prepreg material is applied over the circuit board assembly with holes in the prepreg material substantially aligned with copper pads on the circuit board assembly. The process continues to 606.

At 606, an indium-lead disc is placed in each hole of the prepreg material. The processing continues to 608.

At 608, the frame member is placed over top of the discs. The frame member can have pads on a surface of the frame. The pads are substantially aligned with the indium lead-discs. The process continues to 610.

At 610, the assembly (e.g., the substrate, prepreg, discs and frame) is cured. For example, the assembly can be cured at approximately 125 degrees Celsius in a vacuum atmosphere such as that provided by a vacuum bag system. During the vacuum curing process the indium-lead discs are bonded (or welded) to the copper pads on the printed circuit board and the frame material. The epoxy also cures during this process. As a result, an electrical connection is made between the pads on the frame and the printed circuit board via the indium-lead discs, and the cured epoxy prepreg material forms a water tight seal around the discs and also provides the mechanical connection between the printed circuit board and the frame material. The process continues to 612, where the process ends.

The disc material can include indium, an indium/lead alloy or other suitable material.

It is, therefore, apparent that there is provided, in accordance with the various embodiments disclosed herein, a frame attachment interconnect and methods for making the same.

While the invention has been described in conjunction with a number of embodiments, it is evident that many alternatives, modifications and variations would be or are apparent to those of ordinary skill in the applicable arts. Accordingly, Applicants intend to embrace all such alternatives, modifications, equivalents and variations that are within the spirit and scope of the invention.

What is claimed is:

1. A method for connecting a circuit board and a frame, the method comprising:
   providing a printed wiring board having one or more copper pads applied to a surface thereof;
   providing a frame member having one or more copper pads applied to a surface thereof;
   applying an epoxy glass prepreg material to the surface of the printed wiring board, the prepreg material having one or more holes in substantial alignment with the one or more copper pads on the surface of the printed wiring board;
   placing a metal disc in each hole of the prepreg material so as to be disposed within the hole of the prepreg material and to contact the one or more copper pads on the surface of the printed wiring board;
   placing the frame member on the prepreg material and the metal discs such that the copper pads on the frame member are in substantial alignment with the metal discs; and
   curing in a controlled atmosphere.

2. The method of claim 1, wherein the controlled atmosphere includes a vacuum and a temperature of about 125 degrees Celsius.

3. The method of claim 1, wherein each metal disc includes indium.

4. The method of claim 1, wherein the prepreg material includes a fiber cloth impregnated with a rubberized epoxy.

5. A method for forming an interconnect between a substrate and a frame, the method comprising:
  applying a composite material to a surface of the substrate, the composite material having one or more holes disposed to substantially align with one or more corresponding pads on the surface of the substrate;
  placing a metal disc in each hole of the composite material on top of the corresponding pad;
  placing a frame member on top of the composite material and the metal discs, the frame member having one or more pads disposed to substantially align with the metal discs; and
  curing in a controlled atmosphere.

6. The method of claim 5, wherein the composite material is an epoxy glass prepreg material.

7. The method of claim 5, wherein each metal disc includes an indium-lead alloy.

8. The method of claim 5, wherein each metal disc includes indium.

9. The method of claim 5, wherein the controlled atmosphere includes a vacuum.

10. The method of claim 5, wherein the controlled atmosphere includes a temperature of about 125 degrees Celsius.

11. The method of claim 5, wherein the composite material includes a fiber cloth impregnated with a rubberized epoxy.

12. An interconnect comprising:
  a substrate having a surface with one or more electrical connection pads applied thereto;
  a composite material disposed on the surface of the substrate, the composite material having one or more holes formed to substantially align with the one or more electrical connection pads on the surface of the substrate;
  a metal disc disposed in each of the one or more holes of the composite material; and
  a frame having a surface with one or more electrical connection pads applied thereto,
  wherein the composite material bonds the substrate to the frame, and
  wherein each metal disc makes an electrical connection between a pad on the substrate and a corresponding pad on the frame.

13. The interconnect system of claim 12, wherein the composite material is an epoxy glass prepreg material.

14. The interconnect system of claim 12, wherein each metal disc includes an indium-lead alloy.

15. The interconnect system of claim 12, wherein each metal disc includes indium.

16. The interconnect system of claim 12, wherein the bonding occurs in a controlled atmosphere.

17. The interconnect system of claim 16, wherein the controlled atmosphere includes a temperature of about 125 degrees Celsius.

18. The interconnect system of claim 12, wherein the composite material includes a fiber cloth impregnated with a rubberized epoxy.

19. The interconnect system of claim 16, wherein the controlled atmosphere includes a vacuum.

\* \* \* \* \*